(12) United States Patent
Lin et al.

(10) Patent No.: US 8,633,558 B2
(45) Date of Patent: Jan. 21, 2014

(54) PACKAGE STRUCTURE FOR A CHIP AND METHOD FOR FABRICATING THE SAME

(76) Inventors: Ta-Hsuan Lin, Chiayi (TW); Chuan-Jin Shiu, Taoyuan (TW); Chia-Ming Cheng, Taipei (TW); Tsang-Yu Liu, Hsinchu (TW)

( * ) Notice: Subject to any disclaimer, the term of this patent is extended or adjusted under 35 U.S.C. 154(b) by 81 days.

(21) Appl. No.: 12/981,640

(22) Filed: Dec. 30, 2010

(65) Prior Publication Data

US 2011/0156191 A1  Jun. 30, 2011

Related U.S. Application Data

(60) Provisional application No. 61/291,445, filed on Dec. 31, 2009.

(51) Int. Cl.
*H01L 31/0216* (2006.01)
*H01L 31/18* (2006.01)

(52) U.S. Cl.
USPC ............ 257/433; 257/E31.119; 257/E31.001; 438/72

(58) Field of Classification Search
USPC ............ 257/433, E31.119, E31.001, 98–100, 257/116, 660, 678, 687, 700; 438/72
See application file for complete search history.

(56) References Cited

U.S. PATENT DOCUMENTS

2009/0001495 A1 * 1/2009 Weng et al. ............... 257/433

* cited by examiner

*Primary Examiner* — Matthew W Such
*Assistant Examiner* — Monica D Harrison
(74) *Attorney, Agent, or Firm* — Liu & Liu

(57) ABSTRACT

The embodiment provides a package structure for a chip and a method for fabricating the same. The package structure for the chip includes a chip having a substrate and a bonding pad structure. The chip has an upper surface and a lower surface. An upper packaging layer covers the upper surface of the chip. A spacer layer is between the upper packaging layer and the chip. A conductive path is electrically connected to the bonding pad structure. An anti-reflective layer is disposed between the spacer layer and the upper packaging layer. An overlapping region is between the anti-reflective layer and the spacer layer.

19 Claims, 7 Drawing Sheets

US 8,633,558 B2

PACKAGE STRUCTURE FOR A CHIP AND METHOD FOR FABRICATING THE SAME

CROSS REFERENCE TO RELATED APPLICATIONS

This Application claims the benefit of U.S. Provisional Application No. 61/291,445, filed on Dec. 31, 2009, the entirety of which is incorporated by reference herein.

BACKGROUND OF THE INVENTION

1. Field of the Invention

The present invention relates to a package structure for a chip and a method for fabricating the same, and in particular, relates to a package structure for a chip having an anti-reflective layer and a method for fabricating the same.

2. Description of the Related Art

In the conventional image sensor, optical crosstalk negatively affects image quality. Optical crosstalk occurs, when light, incident into a non-photo-sensitive region or an adjacent image sensor device of an image sensor, is refracted into a sensing region of an image sensor. When optical crosstalk is serious, images of the conventional image sensor are distorted. Additionally, light leakage due to light leaking out of a package structure of a sensing region may also decrease image quality of a conventional image sensor.

Thus, a novel package structure for a chip and a method for fabricating the same are desired.

BRIEF SUMMARY OF THE INVENTION

An exemplary embodiment of a package structure for a chip, comprises: a chip having a substrate and a bonding pad structure, wherein the chip has an upper surface and a bottom surface; an upper packaging layer covering the upper surface of the chip; a spacer layer between the upper packaging layer and the chip; a conductive path electrically connected to the bonding pad structure; and an anti-reflective layer disposed between the spacer layer and the upper packaging layer, wherein the anti-reflective layer and the spacer layer have an overlapping region therebetween.

An exemplary embodiment of a method for fabricating a package structure for a chip, comprises: providing an upper packaging layer and a wafer having at least one chip; forming an anti-reflective layer pattern on the upper packaging layer; bonding the upper packaging layer to an upper surface of the wafer through a spacer layer, wherein the spacer layer covers at least one conductive pad disposed on the wafer, and the anti-reflective layer pattern and the spacer layer have an overlapping region therebetween; forming a conductive path on a lower surface of the wafer to electrically connect to the at least one conductive pad; and performing a cutting process to divide the wafer into individual packaged chips.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
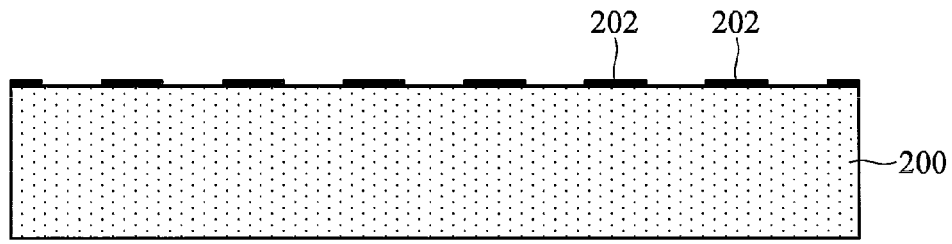
FIGS. 1A-1C are cross sections showing fabrication of an anti-reflective layer according to an embodiment of the invention.

The following description is of a mode for carrying out the invention. Wherever possible, the same reference numbers are used in the drawings and the descriptions to refer the same or like parts. In the drawings, the size of some of the elements may be exaggerated and not drawn to scale for illustrative purposes. The dimensions and the relative dimensions do not correspond to actual dimensions to practice of the invention. This description is made for the purpose of illustrating the general principles of the invention and should not be taken in a limiting sense.

Embodiments of the package structure for chips of the invention packaged by a wafer level packaging (WSP) process may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer level packaging (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer level packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form electronic device packages of multi-layered integrated circuit devices by stacking a plurality of wafers having integrated circuits together.

FIGS. 1A-1C and FIGS. 2A-2H are cross sections showing fabrication of a package structure for a chip 500 according to an embodiment of the invention. An image sensor is used as an exemplary embodiment of a package structure for a chip of the invention. An anti-reflective layer is disposed between a chip and an upper packaging layer of the package structure for a chip to decrease optical crosstalk found in the conventional technology resulting from light incident into a non-photo-sensitive region (for example, light is incident into a spacer layer) refracting into the sensing region or light incident into an adjacent image sensor device refracting into the sensing region. Additionally, the anti-reflective layer of the ??? eliminates light leakage resulting from light incident into the sensing region reflecting out of the package structure for a chip, thereby assuring image quality.

Figure 1B:
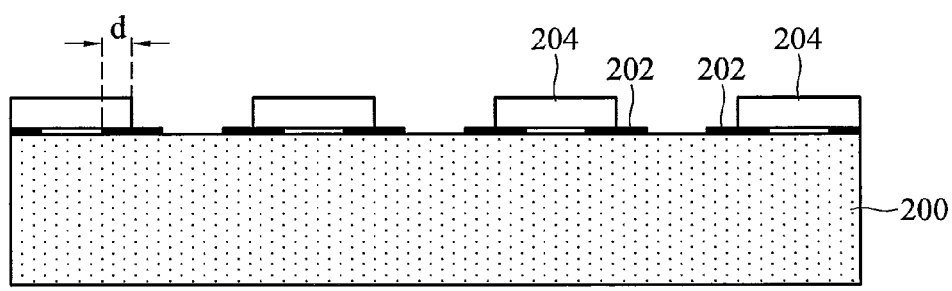
Figure 1C:
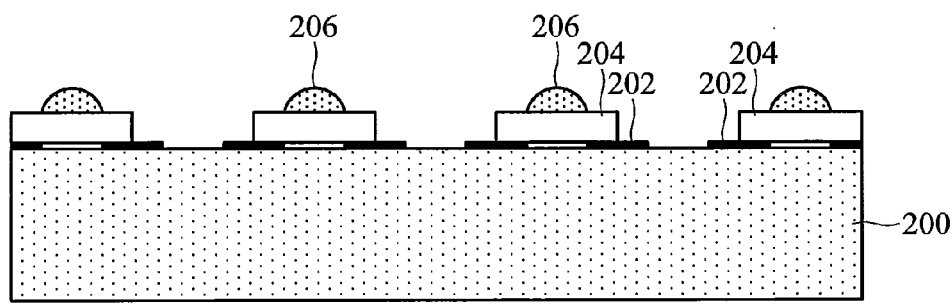

Please refer to FIGS. 1A to 1C, wherein an upper packaging layer 200 is firstly provided. In one embodiment of the invention, the upper packaging layer 200 can allow light to pass therethrough, and the upper packaging layer 200 may be formed of transparent materials comprising eyeglasses level glasses or quartz. Next, anti-reflective layer patterns 202 are formed on the upper packaging layer 200 by coating and photolithography/etching processes. In one embodiment of the invention, materials having characteristics of light blocking, light absorption or light reflection may be selected for the anti-reflective layer pattern 202. For example, the anti-reflective layer pattern 202 may comprise a black resin, bottom anti-reflection coating (BARC) or a metal material such as Cr.

Next, please refer to FIG. 1B, wherein FIG. 1B shows a formation of spacer layer patterns 204. The spacer layer pattern 204 may be formed on the upper packaging layer 200 by processes such as deposition and photolithography processes. As shown in FIG. 1B, the spacer layer pattern 204 is disposed between any two adjacent anti-reflective layer patterns 202, wherein the anti-reflective layer pattern 202 and the underlying spacer layer pattern 204 have an overlapping region d. The overlapping region d can be used to mount the anti-reflective layer pattern 202, and in addition, the overlapping region d can be used to prevent light from directly transmitting through the spacer layer pattern 204. In one embodiment of the invention, isolation materials may be selected for the spacer layer pattern 204 to isolate contamination or prevent moisture from penetrating therein. For example, when a notching process is performed on a wafer substrate to form a cavity, buffer materials may be selected for the spacer layer pattern 204 to prevent the upper packaging layer from breaking. Additionally, when the chip comprises opto electronic devices, the spacer layer pattern 204 may be formed as a dam structure, thereby forming a cavity between the upper packaging layer for light to transmit in thereto and out therefrom and the optical electronic devices are surrounded by the spacer layer pattern 204. Optical characteristics of the optical electronic devices may be improved due to the air in the cavity. In another embodiment of the invention, materials of the spacer layer pattern 204 may be light sensitive epoxy resin, solder mask or other suitable insulating materials, such as, silicon oxide, silicon nitride, silicon oxinitride, metal oxide or combinations thereof of inorganic materials, or polyimide (PI), butylcyclobutene (BCB), parylene, polynaphthalenes, fluorocarbons or accrylates of organic materials.

Next, as shown in FIG. 1C, adhesive materials 206 may be formed on the spacer layer patterns 204 by a printing method. In one embodiment of the invention, the adhesive material 206 may comprise a polymer film, or one or more of adhesives such as epoxy or polyurethane.

Figure 2A:
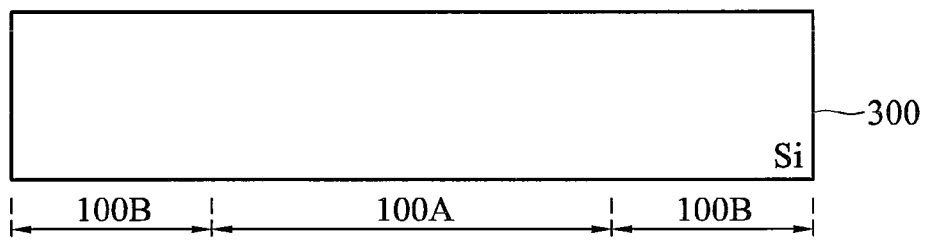
FIGS. 2A-2H are cross sections showing fabrication of a package structure for a chip according to another embodiment of the invention.
Figure 2B:
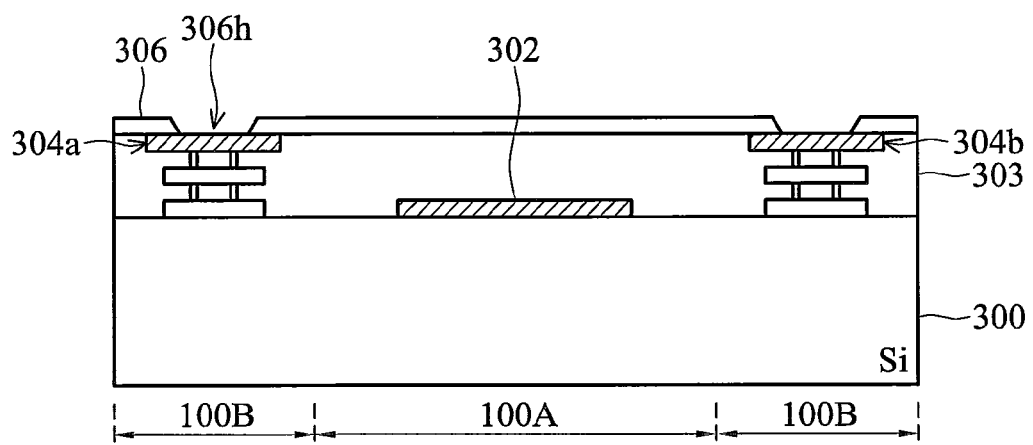

Next, a wafer is provided, wherein an embodiment of fabricating a wafer of the invention is shown as FIGS. 2A and 2B. Please refer to FIG. 2A, wherein a semiconductor substrate 300 generally comprises a semiconductor wafer (for example, silicon wafer) or a silicon substrate. Next, the semiconductor substrate 300 has a plurality of defined device regions 100A. A plurality of peripheral bonding pad regions 100B surrounds the device regions 100A. The device regions 100A and the peripheral bonding pad regions 100B together, form a portion of a chip region.

Next, as shown in FIG. 2B, a semiconductor device 302 such as image sensors or micro electro-mechanical systems (MEMS) is fabricated in the device region 100A. An intermetal dielectric (IMD) layer 303 covers the semiconductor substrate 300 and the semiconductor device 302. Generally, low k insulating materials such as a porous oxide layer may be selected for the intermetal dielectric layer 303. Next, a plurality of conductive pad structures 304 are fabricated in the intermetal dielectric layer 303 in the peripheral bonding pad regions 100B. The conductive pad structures may be preferably formed of Cu, Al or other suitable metal materials.

Additionally, the semiconductor substrate 300 may be covered by a chip passivation layer 306 with electrically connecting devices in the chip to the outside circuits. The chip passivation layer 306 may be pre-defined to form a plurality of openings 306h exposing the conductive pad structures.

Figure 2C:
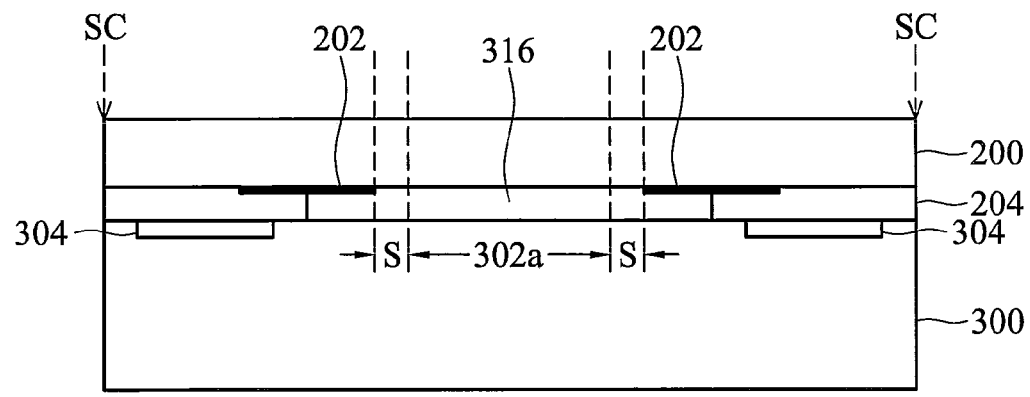

Next, as shown in FIG. 2C, an upper packaging layer 200 is provided and bounded to the semiconductor substrate 300. For the semiconductor substrate 300, only bonding pad structures 304 are disclosed for brevity. In one embodiment, the upper packaging layer 200 may be bonded to the semiconductor substrate 300 via the adhesive material 206 disposed on the spacer layer pattern 204, wherein the spacer layer pattern 204 is between the semiconductor substrate 300 and the upper packaging layer 200, thereby forming a cavity 316 between the semiconductor substrate 300 and the upper packaging layer 200. In the cavity, the device region is surrounded by the spacer layer pattern 204. In this embodiment, the semiconductor substrate 300 may comprise a plurality of chips, and each chip is isolated from other chips by a scribe line SC. As shown in FIG. 2C, a photosensitive region 302a is disposed on each chip to fabricate a light sensing device with a corresponding micro array structure (not shown) covered thereon. In one embodiment of the invention, a light sensing device may be a complementary metal-oxide-semiconductor (CMOS) device or a charge-coupled device (CCD) used for sensing images or pictures.

As shown in FIG. 2C, a portion of the anti-reflective layer pattern 202 extends into the cavity 316. It is noted that the photosensitive region 302a and the anti-reflective layer pattern 202 have a spacing S therebetween, thereby preventing light incident into the photosensitive region 302a from being blocked by the anti-reflective layer pattern 202. In one embodiment of the invention, the spacing S between the photosensitive region 302a and the anti-reflective layer pattern 202 may between about 2 μm and 100 μm. Preferably, the horizontal spacing S between the photosensitive region 302a and the anti-reflective layer pattern 202 may be between about 5 μm and 40 μm.

Figure 2D:
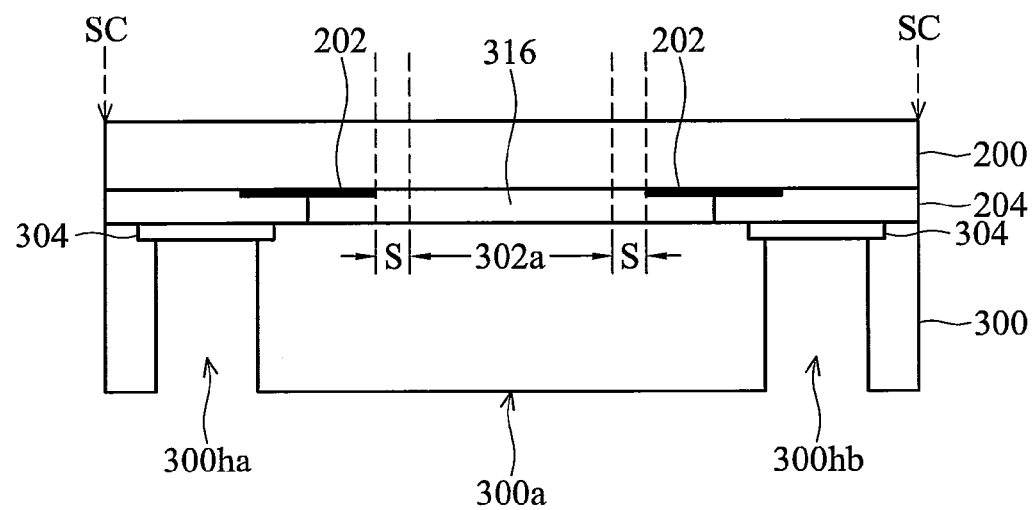

Please refer to FIG. 2D, wherein the upper packaging layer 200 may serve as a carrier substrate for an etching process performed on a lower surface 300a of the semiconductor substrate 300. For example, a portion of the semiconductor substrate 300 is removed by a process such as an anisotropic etching process to form openings 300ha and 300hb therein, exposing the conductive pad structures 304.

Figure 2E:
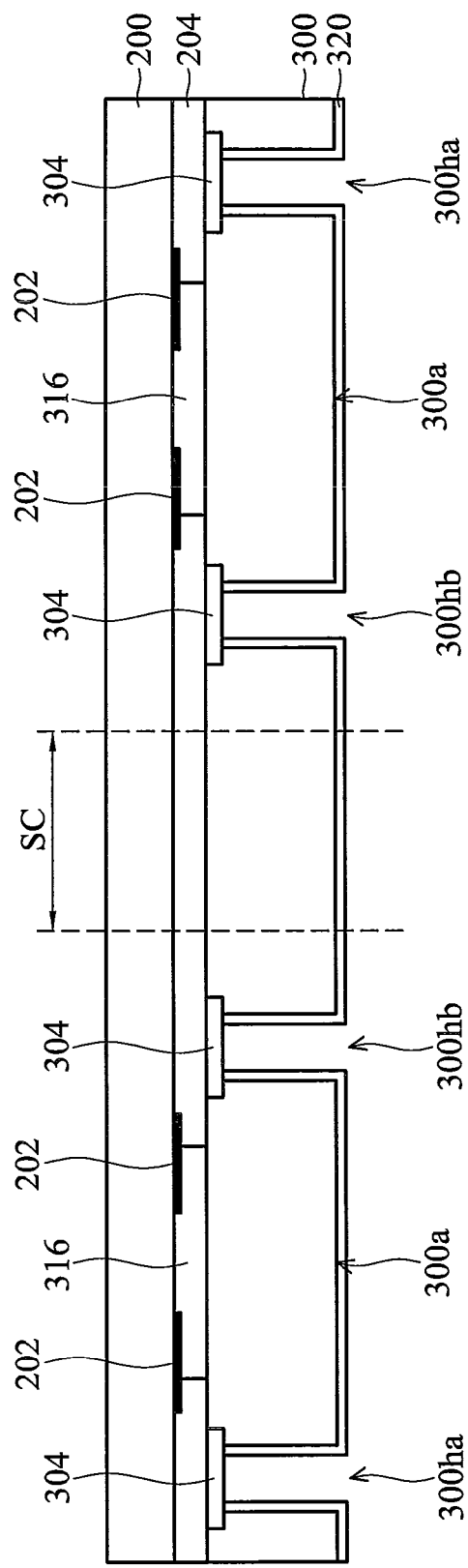

FIG. 2E is a cross section showing the semiconductor substrate 300 with a larger range. FIG. 2E further shows an adjacent cutting region and another chip region in addition to the portion of the chip region as shown in FIG. 2D.

As shown in FIG. 2E, an insulating layer 320 made of, for example, polymer such as a pilyimide film, exposing the conductive pad structure 304, is optionally formed in the openings 300ha and 300hb. A silicon oxide layer may be formed in the openings 300ha and 300hb, extending to the lower surface 300a of the semiconductor substrate 300, by a thermal oxidation or plasma chemical vapor deposition method. Next, the insulating layer on a bottom of the openings 300ha and 300hb is removed (by a process such as a photolithography process) to expose the conductive pad structures 304. In this embodiment, the insulating layer 320 in the openings 300ha and 300hb is formed at the same time.

Figure 2F:
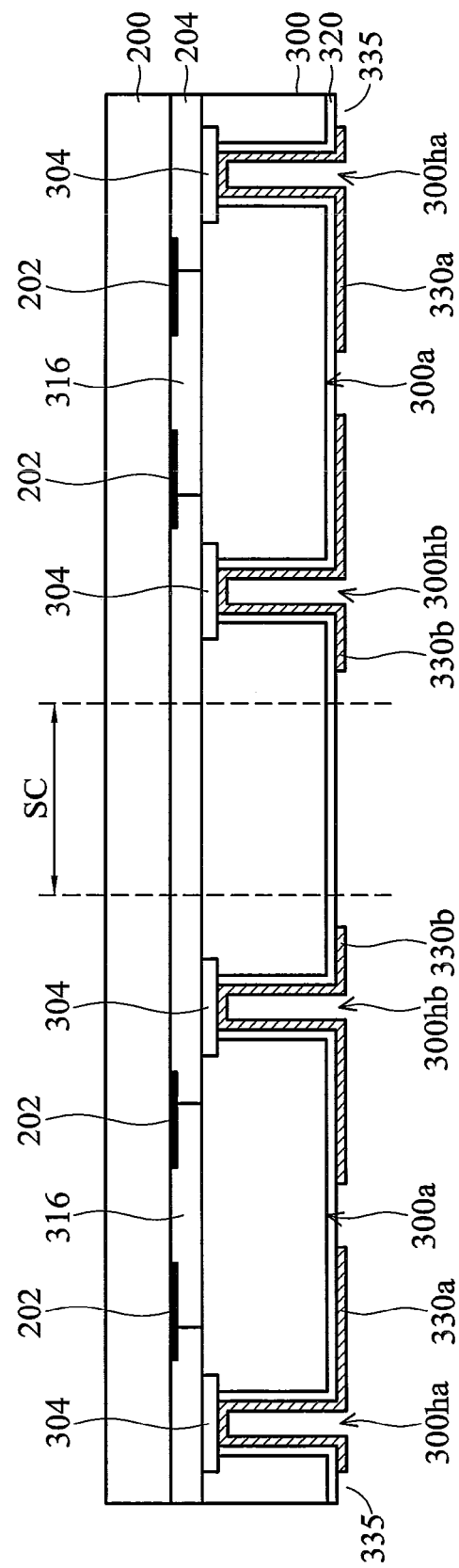

Next, as shown in FIG. 2F, a first conductive layer 330a and a second conductive layer 330b are respectively formed in the openings 300ha and 300hb. In this embodiment, the first conductive layer 330a and the second conductive layer 330b are redistribution patterns. Therefore, the first conductive layer 330a and the second conductive layer 330b are further formed extending on the lower surface 300a of the semiconductor substrate 300 in addition to extending on the sidewalls of the openings 300ha and 300hb.

The formation method of the first conductive layer 330a and the second conductive layer 330b may comprise processes such as physical vapor deposition, chemical vapor deposition, electroplating or electroless plating processes. The first conductive layer 330a and the second conductive layer 330b may be formed of metal materials, for example, Cu, Al, Ag or combinations thereof. The first conductive layer 330a and the second conductive layer 330b may be further formed of conductive oxides, for example, indium titanium oxide (ITO), indium zinc oxide (IZO) or combinations thereof. In one embodiment, a conductive layer is conformably formed on the entire semiconductor substrate 300, and then the conductive layer is patterned to form the conductive pattern distributions as shown in FIG. 2F, thereby forming conductive paths. The conductive layer is conformably formed on the sidewalls of the openings 300ha and 300hb as shown in FIG. 2E. However, in other embodiments, the conductive layer can also substantially fill the openings 300ha and 300hb. Additionally, in this embodiment, the first conductive layer 330a and the second conductive layer 330b in the openings 300ha and 300hb are isolated from the semiconductor substrate 300 by a single insulating layer 320. Moreover, the composition and disposition of the conductive paths in the aforementioned embodiment is only for description, and are not limiting. For example, the conductive paths may also be formed on parts of the scribe lines.

Figure 2G:
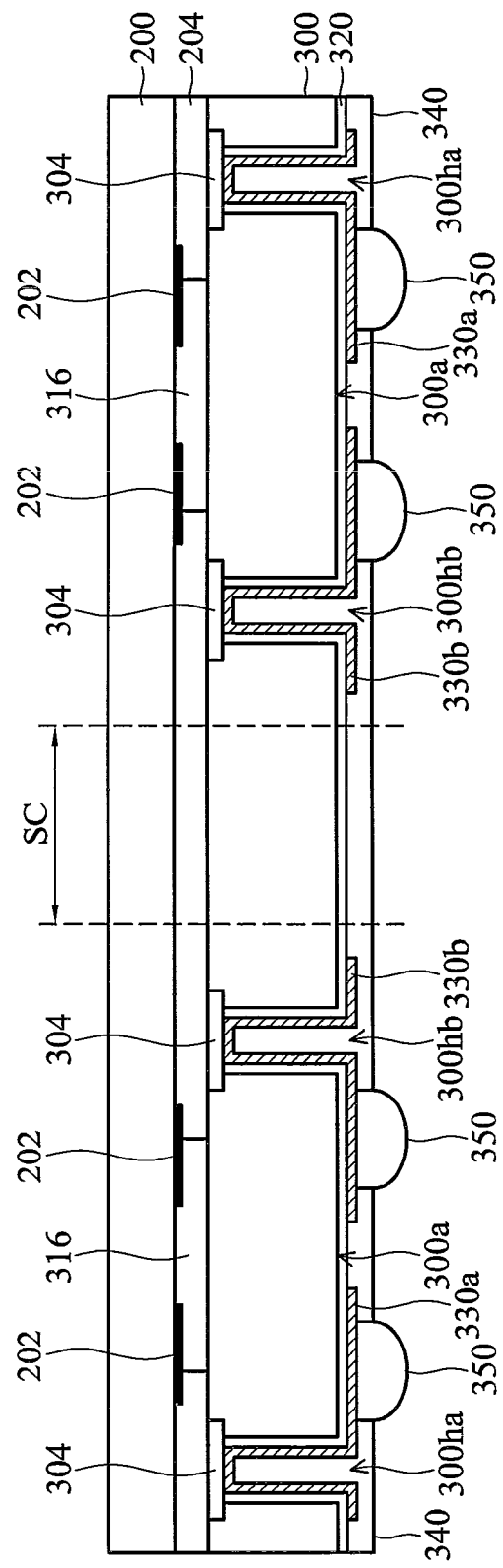

Next, please refer to FIG. 2G, wherein FIG. 2G shows a formation of a passivation layer 340. In one embodiment of the invention, the passivation layer 340 may be, for example, a solder mask. The passivation layer 340 may be formed on the lower surface 300a of the semiconductor substrate by a method, such as, coating of a solder material. Next, a patterning process is performed on the passivation layer 340 to form terminal contact openings exposing a portion of the first conductive layer 330a and the second conductive layer 330b. Next, under bump metallurgy (UBM) layers (not shown) and conductive bumps 350 are formed in positions of the terminal contact openings. For example, the UBM layers may be formed of conductive materials, such as metals or metal alloys such as Ni layers, Ag layers, Al layers, Cu layers or alloys thereof, or materials of doped polysilicon, monocrystalline silicon or conductive glasses. Additionally, refractory metal materials such as titanium, molybdenum, chromium or titanium tungsten layers can be used to individually form the UBM layers or be combined with other metal layers. In a specific embodiment, a Ni/Ag layer may be formed on a portion of a surface or the entire surface of the metal layer. The conductive bumps 350 may be electrically connected to the conductive pad structures 304 through the first conductive layer 330a and the second conductive layer 330b. Next, the semiconductor substrate 300 is cut along a scribe line region SC in the peripheral bonding pad region, and thus a plurality of divided package structures for chips is formed. A cross section of a package structure for a chip 500 formed by slicing is shown in FIG. 2H.

Figure 2H:
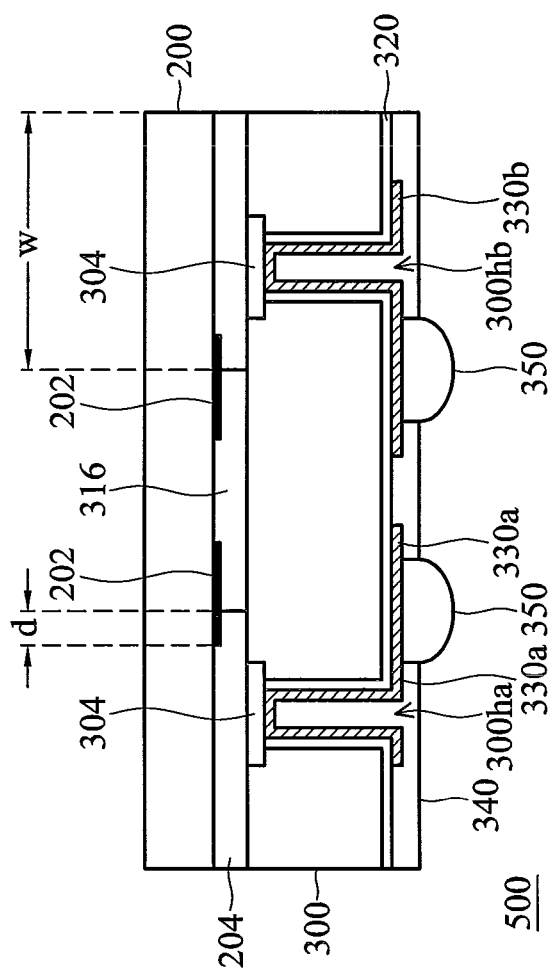

As shown in FIG. 2H, in one embodiment of the invention, the overlapping region d between the spacer layer pattern 204 and the anti-reflective layer pattern 202 overlying each chip may have a minimum value of about 5 µm and a maximum value equal to a half of a width w of the spacer layer pattern 204.

The package structure for a chip 500 of this embodiment comprises: a chip having a substrate 300 and a bonding pad structure 304; an upper packaging layer 200 mounted on the upper surface of the substrate 300 through a spacer layer pattern 204; conductive paths 330a and 330b disposed in the substrate 300, electrically connected to the bonding pad structure 304 through a lower surface of the substrate 300; and an anti-reflective layer pattern 202 disposed between the spacer layer pattern 204 and the upper packaging layer 200, wherein the anti-reflective layer pattern 202 and the spacer layer pattern 204 have an overlapping region d therebetween having a minimum value of about 5 µm and a maximum value equal to a half of a width w of the spacer layer pattern 204. Additionally, the photosensitive region 302a and the anti-reflective layer pattern 202 have a spacing S therebetween with a value between about 2 µm and 100 µm or between about 5 µm and 40 µm.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure for a chip, comprising:
   a chip having a substrate and a bonding pad structure, wherein the chip has an upper surface and a lower surface;
   an upper packaging layer covering the upper surface of the chip;
   a spacer layer between the upper packaging layer and the chip;
   a conductive path electrically connecting to the bonding pad structure; and
   an anti-reflective layer disposed between the spacer layer and the upper packaging layer, wherein the anti-reflective layer and the spacer layer have an overlapping region therebetween and a non-overlapping region in which the anti-reflective layer and the spacer layer do not contact, wherein the anti-reflective layer surrounds a photosensitive region on the substrate, and wherein a portion of the anti-reflective layer in the non-overlapping region extends towards the photosensitive region.

2. The package structure for a chip as claimed in claim 1, wherein the substrate further comprises a device region surrounded by the spacer layer.

3. The package structure for a chip as claimed in claim 2, wherein the spacer layer forms a cavity between the substrate and the upper packaging layer, and the portion of the anti-reflective layer in the non-overlapping region extends into the cavity to cover a portion of the substrate not covered by the spacer.

4. The package structure for a chip as claimed in claim 3, wherein the device region and the anti-reflective layer have a horizontal spacing therebetween.

5. The package structure for a chip as claimed in claim 4, wherein the horizontal spacing is between 2 µm and 100 µm.

6. The package structure for a chip as claimed in claim 4, wherein the horizontal spacing is between 5 µm and 40 µm.

7. The package structure for a chip as claimed in claim 1, wherein the overlapping region has a minimum value of 5 µm.

8. The package structure for a chip as claimed in claim 1, wherein the overlapping region has a maximum value equal to a half of a width of the spacer layer.

9. The package structure for a chip as claimed in claim 1, wherein the anti-reflective layer comprises a black resin, anti-reflection coating or metal material.

10. The package structure for a chip as claimed in claim 1, further comprising an adhesive layer between the upper packaging layer and the anti-reflective layer, wherein the adhesive layer covers a portion of the anti-reflective layer.

11. The package structure for a chip as claimed in claim 1, wherein the anti-reflective layer completely and continuously surrounds the photosensitive region on the wafer.

12. The package structure for a chip as claimed in claim 1, wherein the anti-reflective layer comprises a material that blocks light.

13. A method for fabricating a package structure for a chip, comprising:

providing an upper packaging layer and a wafer having at least one chip;

forming an anti-reflective layer pattern on the upper packaging layer;

bonding the upper packaging layer to an upper surface of the wafer through a spacer layer, wherein the spacer layer covers at least one conductive pad disposed on the wafer, wherein the anti-reflective layer pattern and the spacer layer have an overlapping region therebetween and a non-overlapping region in which the anti-reflective layer pattern and the spacer layer do not contact, wherein the anti-reflective layer pattern surrounds a photosensitive region on the wafer, and wherein a portion of the anti-reflective layer pattern in the non-overlapping region extends towards the photosensitive region; and forming a conductive path on a lower surface of the wafer to electrically connect to the at least one conductive pad.

14. The method for fabricating a package structure for a chip as claimed in claim 13, wherein the spacer layer forms a cavity between the substrate and the upper packaging layer, and the portion of the anti-reflective layer pattern in the non-overlapping region extends into the cavity to cover a portion of the wafer not covered by the spacer.

15. The method for fabricating a package structure for a chip as claimed in claim 14, wherein a region surrounded by the spacer layer comprises a device region, and the device region and the anti-reflective layer pattern have a horizontal spacing therebetween.

16. The method for fabricating a package structure for a chip as claimed in claim 13, wherein the anti-reflective layer pattern comprises a black resin, anti-reflection coating or metal material.

17. The method for fabricating a package structure for a chip as claimed in claim 13, wherein the anti-reflective layer pattern completely and continuously surrounds the photosensitive region on the substrate.

18. The method for fabricating a package structure for a chip as claimed in claim 13, wherein the anti-reflective layer pattern comprises a material that blocks light.

19. The method for fabricating a package structure for a chip as claimed in claim 13, wherein the wafer has a plurality of chips, and wherein the method further comprises performing a cutting process to divide the wafer into individual packaged chips.

* * * * *